United States Patent
Dequina et al.

(10) Patent No.: US 7,514,992 B2
(45) Date of Patent: Apr. 7, 2009

(54) CIRCUIT FOR GENERATING PRECISION SOFT-START FREQUENCY FOR EITHER VALUE OF ADDRESS BIT APPLIED TO EXTERNAL RESET PIN

(75) Inventors: Noel B. Dequina, Flemington, NJ (US); Robert Haynes Isham, Flemington, NJ (US)

(73) Assignee: Intersil Americas Inc., Milpitas, CA (US)

(*) Notice: Subject to any disclaimer, the term of this patent is extended or adjusted under 35 U.S.C. 154(b) by 74 days.

(21) Appl. No.: 11/358,609

(22) Filed: Feb. 21, 2006

(65) Prior Publication Data

US 2007/0146006 A1    Jun. 28, 2007

Related U.S. Application Data

(60) Provisional application No. 60/753,896, filed on Dec. 23, 2005.

(51) Int. Cl.
*H03K 17/687* (2006.01)

(52) U.S. Cl. .................. 327/603; 327/198; 323/282; 323/283; 323/284; 323/287

(58) Field of Classification Search .................. 327/198, 327/603; 323/282, 283, 284, 287
See application file for complete search history.

(56) References Cited

U.S. PATENT DOCUMENTS

| 6,081,140 | A | * | 6/2000 | King | 327/77 |
| 6,094,039 | A | * | 7/2000 | Farrenkopf | 323/283 |
| 6,100,677 | A | * | 8/2000 | Farrenkopf | 323/285 |
| 6,700,365 | B2 | * | 3/2004 | Isham et al. | 323/317 |
| 6,992,473 | B2 | * | 1/2006 | Marschalkowski et al. | 323/315 |
| 2002/0109471 | A1 | * | 8/2002 | Adams et al. | 315/363 |

* cited by examiner

*Primary Examiner*—Kenneth B Wells
*Assistant Examiner*—John W Poos
(74) *Attorney, Agent, or Firm*—Fogg & Powers LLC

(57) ABSTRACT

A multi-function circuit has as single input/control pin, to which respectively different values of a control input may be applied. A multi-function signal generation section is coupled to the single input/control pin and is operative to controllably generate a plurality of respectively different functional outputs, including a decoded address bit-representative output, a soft-start oscillator signal output, and a reset output, in response to application of respectively different values of the control input.

18 Claims, 1 Drawing Sheet

CIRCUIT FOR GENERATING PRECISION SOFT-START FREQUENCY FOR EITHER VALUE OF ADDRESS BIT APPLIED TO EXTERNAL RESET PIN

CROSS-REFERENCE TO RELATED APPLICATION

The present application claims the benefit of U.S. patent application Ser. No. 60/753,896, filed Dec. 23, 2005, by Noel Dequina et al, entitled: "Circuit for Generating Precision Soft-Start Frequency for Either Value of Address Bit Applied to External Reset Pin," assigned to the assignee of the present application and the disclosure of which is incorporated herein.

FIELD OF THE INVENTION

The present invention relates in general to switched power supply systems, such as, but not limited to, synchronous rectified buck mode DC-DC converter systems and subsystems thereof, and is particularly directed to a new and improved, single pin-controlled, multi-function circuit that is operative to generate a plurality of respectively different functional outputs, in response to the application of respectively different values of a control voltage to a single input/control pin. These respectively different functional outputs include a first, decoded address bit-representative output, a second, soft-start oscillator signal, and a third, reset output.

BACKGROUND OF THE INVENTION

In addition to the standard set of driver functions of control/driver circuitry for establishing the switching times of the output devices (MOSFETs) of a DC-DC converter power supply system, such as a synchronous rectified buck mode DC-DC converter, there are additional or auxiliary functions that may be desired for some control/driver applications. In today's driver integrated circuit (IC) market, an eight-pin SOIC package is typically employed for half-bridge driver implementations. Unfortunately, this eight pin constraint means that only a single pin is available for auxiliary functions, such as allowing the customer to specify a '1' or '0' value for the least significant bit (LSB) of the device's address. The driver's remaining six address bits are internally hard coded in accordance with a standard seven bit addressing scheme, and the remaining pins of the SOIC package are already taken for the basic operation of the driver IC. The problem is how to interface additional signals to the control/driver IC, in the face of the unavailability of one or more pins for the purpose.

SUMMARY OF THE INVENTION

In accordance with the present invention, the above-described pin limitation problem is successfully addressed by a new and improved multi-function circuit, that is operative to generate a plurality of respectively different functional outputs, in response to the application of respectively different values of a control voltage to a single input/control pin. These respectively different functional outputs include a first, decoded address bit-representative output, that corresponds to the logical value ('1' or '0') of the control voltage; a second, soft-start oscillator signal, that may be used to establish switching times of output devices (MOSFETs) of an associated DC-DC converter power supply system, in response to the application of either of the two logical values of the address bit-defining control voltage; and a third, reset output, that is selectively produced in response to the coupling of a prescribed external reset voltage to the single pin.

For this purpose, the single pin-based multi-function circuit of the invention comprises a programmable 'off-chip' section, to a single input/control pin of which respectively different control inputs may be applied, and an 'on-chip' signal generation section, a given function/property of which is selectively programmable by the value of the control input applied to the single input/control pin of the 'off-chip' programming section. In addition to the use of the input/control pin to specify a least significant bit of the driver's multi-bit address, and trigger the generation of a precision soft-start frequency signal in response to either of two address bit-defining voltages being applied to an input resistor of the off-chip programming section, the input/control pin is adapted to selectively receive an external IC register reset signal via a signal-coupling path that by-passes the input resistor. As long as the soft-start condition is completed, the 'on-chip' signal generation section will respond to the application of the external reset signal by way of this resistor by-pass path, and generate a register reset output for application to the reset terminal of a downstream register; if the soft-start condition has not been completed, the external reset signal will be ignored.

The 'on-chip' signal generation section includes a relatively small valued resistor that couples the input/control pin of the off-chip programming section to the emitters of first and second bipolar transistors. The base of the first transistor is coupled to the emitter of a third bipolar transistor, to the base of a fourth bipolar transistor, and to the drain of a first current mirror MOSFET of a first, VCC-referenced current mirror stage, which includes second, third and fourth current mirror MOSFETs. The drain of the second current mirror MOSFET sources the collector-emitter current of the first bipolar transistor, while the drain of first current mirror MOSFET is coupled to the emitter of the third bipolar transistor. The base of the third bipolar transistor is coupled to receive a reference voltage VREF, while its collector is coupled to GND.

The collector of the fourth bipolar transistor is coupled directly to the base of a fifth bipolar transistor and through a resistor to a supply rail VCC. The fourth bipolar transistor has its emitter coupled through a resistor to ground, while the second bipolar transistor has its collector coupled to a first current mirror MOSFET of a second, GND-referenced current mirror stage, which further includes second through fourth current mirror MOSFETs. The collector of the fifth bipolar transistor is coupled to the supply rail VCC, while its emitter is coupled to the base of the second bipolar transistor and to the drain of the second current mirror MOSFET of the second current mirror stage. The drain of a third current mirror MOSFET of the second current mirror stage is coupled to commonly connected gates of the current mirror MOSFETs of the first current mirror stage, while the drain of a fourth current mirror MOSFET of the second current mirror stage is coupled to the input of a first output inverter.

The first output inverter provides a first output representative of the logical value of the address bit-representative voltage applied to the input/control pin of the 'off-chip' programming section. The input of the first output inverter is also coupled to the output of a first, relatively small valued 'pull-up' current source. The relatively small valued current produced by the first current source serves to 'slightly' pull the input of the first output inverter high, so that the default value of its output, and thereby the value of the address bit, will be a logical low ('0').

The drain of a third current mirror of the first current mirror stage is coupled to the input of a second output inverter, to which a pull-down current from a second, 'pull-down' current source is coupled. The second, 'pull-down' output inverter is used to supply a second output terminal with a logical 'low' as a valid reset signal, in response to an external reset being applied to the input/control pin by way of the input resistor by-pass path.

In order to generate a soft-start frequency signal, the on-chip section includes an oscillator stage coupled to the input of a third output inverter whose output provides the soft-start frequency signal. The oscillator stage includes a pair of capacitors and a comparator, which is coupled to receive a current mirrored by the fourth current mirror MOSFET of the first current mirror stage. This mirrored current is sued to charge one of the capacitors. The voltage developed on the charged capacitor is compared by the comparator with a reference voltage VREF. The output of the comparator is used to control the operation of the oscillator stage, such that the third output inverter produces a periodic soft-start oscillator output signal. The frequency of this soft-start output signal is defined in accordance with the values of the capacitors and the capacitor charging current supplied from the fourth current mirror MOSFET. The oscillator stage includes an oscillator disabling MOSFET, that has its source-drain path coupled between GND and the comparator, and its gate coupled to receive a disable input DIS for controllably disabling the operation of the oscillator stage.

As pointed out above, the 'on-chip' signal generation section responds to different inputs applied to the input/control pin of the 'off-chip' programming section to generate respectively different outputs, including the logical value ('1' or '0') of the LSB bit of the driver's address, a soft-start oscillator output signal, and a reset signal. If the LSB bit is a logical '0', the input resistor of the 'off-chip' programming section will be connected to GND for the purpose of specifying the address bit (LSB) as a logical '0'. For either value of the LSB-representative voltage, an external reset signal may be applied to the gate of a MOSFET switch within the reset signal-coupling path that by-passes the input resistor, causing a logical low (GND='0') to be coupled to the input/control pin.

Coupling the input resistor to ground causes a logical low (GND='0') voltage to be applied via a series path through that resistor and the relatively small valued resistor that couples the input/control pin of the off-chip programming section to the emitters of first and second bipolar transistors, so that these transistors are turned ON. With the first transistor turned ON, its collector-emitter current, which is sourced by the drain of second current mirror MOSFET of the first current mirror stage, is mirrored by the first current mirror MOSFET of that stage to the emitter-collector path of the second bipolar transistor. With both transistors turned ON, the third through fifth transistors and the current mirror MOSFETs of the second current mirror stage are held OFF.

Because the first and second bipolar transistors are complementary polarity devices, a summation of their respective base-emitter voltage drops yields a voltage VREF at the emitter of the first bipolar transistor. As a result, the collector-emitter current of the first bipolar transistor, which corresponds to the input current of the first current mirror stage, is equal to a value defined by a division of the emitter voltage VREF of the first bipolar transistor by the sum of the values of the two series-connected input resistors. This current is used to set the frequency of the soft-start oscillation signal produced by the third output inverter, and to produce a pull-up current, which is a fraction of the collector-emitter current through the first bipolar transistor, in opposition to the fixed pull-down current applied by the 'pull-down' current source to the input of the second output inverter, that is used to generate the reset signal.

To accomplish the soft-start oscillation signal-generating function, this current is mirrored by the fourth current mirror MOSFET of the first current mirror stage, and coupled to the oscillator stage. This mirrored current charges one of the capacitors, with the resulting voltage developed on that capacitor being coupled to the comparator. The comparator compares this voltage with the reference voltage and controls the oscillator, so that the third output inverter produces a periodic output signal, the frequency of which is defined in accordance with the values of the oscillator's capacitors, and the capacitor-charging current coupled from the fourth current mirror MOSFET of the first current mirror stage.

In order to carry out the reset function, once the soft-start operation has completed, an external reset is applied to the gate of the MOSFET switch within the reset signal-coupling path that by-passes the input resistor, causing a logical low (GND='0') to be coupled to the input/control pin. This couples the input/control pin to ground potential, so as to effectively remove the input resistor from the circuit. This causes the emitter-collector current through the first bipolar transistor to have a relatively large value. This larger valued current, when mirrored by the third current mirror MOSFET of the first current mirror stage and applied to the input of the second output inverter, overcomes the pull-down current applied from the 'pull-down' current source to the input of the second output inverter, so that the input of the second output inverter is effectively at a logical 'high'. A logical high at the input of the second output inverter causes its output to go low, thereby providing a valid reset signal for application to the reset terminal of a downstream register.

As noted above, with the input resistor of the 'off-chip' programming section being connected to GND (in order to specify the address bit (LSB) as a logical '0'), the third through fifth transistors and the current mirror MOSFETs of the second current mirror stage are held OFF. Since the fourth current mirror MOSFET of the second current mirror stage is turned OFF, so that it supplies no current to the input of the first output inverter, whereby the relatively small valued pull-up current supplied by the pull-up current source to the input of the first output inverter is sufficient to pull the input of that inverter high, making its output terminal a logical low ('0')— thereby specifying that the address bit (LSB) as a logical '0', as intended.

In order to specify the device's address bit (LSB) as a logical '1', the input resistor of the 'off-chip' programming section is connected to the high voltage rail (VCC). (The manner in which the circuit produces a valid reset signal RESET at the output terminal of the second output inverter, as a result of such a connection, is the same as that described above, for the case that the input resistor of the 'off-chip' programming section is connected to the low voltage rail (GND)). Connecting the input resistor to the VCC supply rail causes a relatively high voltage to be coupled through the series-connected resistors to the emitter of the first bipolar transistor, so that the base-emitter junction of this transistor is reversed-biased, causing it to be turned OFF.

With the first bipolar transistor turned off, no collector-emitter current flows therethrough. However, the high voltage applied through the series-connected input resistors to the emitter of the first bipolar transistor produces a relatively high positive voltage at its base, which is applied to the emitter of the third bipolar transistor, forward-biasing the base-emitter junction of that transistor, so that the third bipolar transistor is turned ON.

With the third bipolar transistor turned ON, a positive voltage is coupled to the base of the fourth bipolar transistor, turning it ON. In addition, the high voltage (VCC) applied through the input resistors to the emitter of the first bipolar transistor is coupled to the emitter of the second bipolar transistor, so that the second bipolar transistor is also turned on. With the second bipolar transistor turned ON, the collector-emitter current therethrough flows into the first current mirror MOSFET of the second current mirror stage and is mirrored by its remaining current mirror MOSFETs.

Since the first and fourth bipolar transistors are complementary polarity devices, a summation of their respective base-emitter voltage drops yields a voltage VREF (which is applied to the base of the third transistor) at the emitter of the fourth bipolar transistor. As a result, the collector-emitter current through the fourth bipolar transistor is equal to the value of the voltage value VREF (the emitter voltage of the fourth bipolar transistor) divided by the value of its emitter resistor coupled to GND. The flow of this collector-emitter current through a collector resistor connected between the supply rail VCC and the base of the fifth transistor causes the base voltage of the fifth bipolar transistor to be equal to the difference between the VCC supply rail voltage and the product of the value of the collector resistor and the collector-emitter current.

The base voltage of the fifth bipolar transistor can be set equal to VREF, and the collector-emitter voltage of the second bipolar transistor can be set equal to the base voltage of the fifth bipolar transistor. As a result, the value of the second transistor's collector-emitter current can be represented by an expression having a voltage difference component that is equal to VREF, so that the collector-emitter current through the second bipolar transistor has the same value as the case where the logical value of the address bit is a logical '0'.

This current is coupled to the first current mirror MOSFET of the second current mirror stage and mirrored by the second current mirror MOSFET thereof to the first current mirror stage. It is then mirrored by the fourth current mirror MOSFET of the first current mirror stage, and coupled to the oscillator stage, causing one of its capacitors to be charged, so that the same soft-start oscillator output signal will be generated at the output terminal of the third output inverter. Namely, the multi-function circuit of the invention is operative to produce the same soft-start frequency output signal, irrespective of whether the input resistor of the 'off-chip' programming section is coupled to a logical high ('1') voltage value (VCC) or to a logical low ('0') voltage value (GND).

Since the input resistor is connected to VCC to specify the address bit (LSB) as a logical '1', each of the current mirror MOSFETs of the second current mirror stage will be turned ON. Since the fourth current mirror MOSFET of the second current mirror stage is turned ON, it supplies the input of the first output inverter with a substantial value of current that is much larger than, and thereby overcomes, the relatively low valued pull-up current sourced from the 'pull-up' current source. As a consequence, the input of the first output inverter is driven to a logical low ('0'), making its output terminal a logical high ('1'), and specifying the LSB address bit as a logical '1', as intended.

BRIEF DESCRIPTION OF THE DRAWINGS

The FIGURE schematically illustrates an embodiment of a single input pin-based multi-function circuit of the invention, which is operative to generate the same precision soft-start frequency signal for each of two logical values of an address bit applied to the single input pin, and to also allow an external reset signal to be applied to that same input pin, in response to which the circuit outputs a register reset signal.

DETAILED DESCRIPTION

Figure 1:
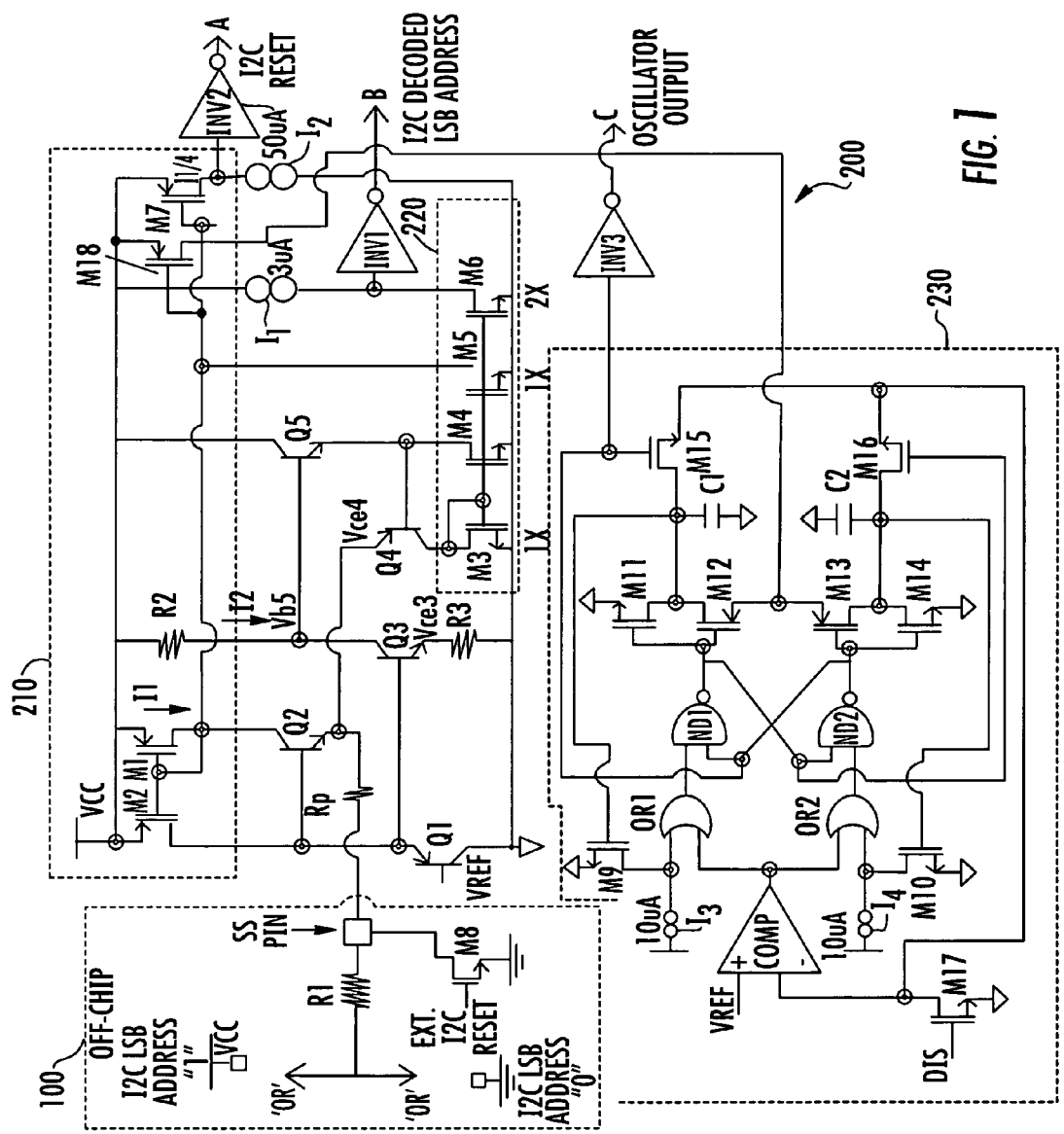

Before describing the details of a non-limiting embodiment of the single pin-based multi-function circuit of the present invention, it should be observed that the invention resides primarily in a modular arrangement of conventional electronic circuit components. In terms of a practical implementation facilitating its manufacture as a printed circuit-based package that may be readily incorporated into the driver circuitry for a DC-DC converter, this modular arrangement may be readily configured as field programmable gate array (FPGA) and application specific integrated circuit (ASIC) chip set. As a consequence, the circuit configuration of the inventive oscillator and the manner in which it is interfaced with a DC-DC converter's output MOSFET driver circuitry and a single control/programming pin therefor have been illustrated in a readily schematic diagram format, which shows only those specific details that are pertinent to the present invention, so as not to obscure the disclosure with details that will be readily apparent to one skilled in the art having the benefit of the description herein.

Attention is now directed to the single FIGURE of drawings, which diagrammatically illustrates an embodiment of the single pin-based multi-function circuit of the invention as including a single pin-programmable 'off-chip' section 100, to which respectively different function/property control inputs may be applied, and an 'on-chip' signal generation section 200, a given function/property of which is selectively programmable by the value of an input applied to the single input pin of the 'off-chip' programming section 100.

As will be described, the 'on-chip' signal generation section 200 is operative to generate a prescribed soft-start frequency signal that may be used to control the switching times of the output MOSFETs of a synchronous rectified buck mode DC-DC converter, in response to either of two voltages (e.g., VCC and ground (GND)), which are respectively representative of different logical values ('1' and '0') of an address bit, being applied through an input resistor R1 to a single address bit (e.g., least significant bit (LSB))-representative mode control pin SS of the off-chip programming section 100.

In addition to the dual use of the SS pin to both specify the LSB of the driver's multi-bit address, and trigger the oscillator's generation of a precision soft-start frequency signal, this same (SS) pin is adapted to be coupled directly (by-passing input resistor R1) to GND (logical '0'), by way of the source-drain path of a relatively small MOSFET switch M8, in response to an IC register reset signal 'EXT RESET' being selectively applied to the gate of the MOSFET switch M8. As long as the soft-start condition is completed, the 'on-chip' signal generation section 200 will respond to the application of the external reset signal EXT RESET to the gate of MOSFET switch M8 and generate a register reset output; if not, the external reset signal EXT RESET will be ignored.

The 'on-chip' signal generation section 200 includes a relatively small valued resistor Rp, a first end of which is coupled to the SS pin of the off-chip programming section 100, and a second end of which is coupled to the emitter of an NPN bipolar transistor Q2 and to the emitter of a PNP bipolar transistor Q4. The base of NPN transistor Q2 is coupled to the emitter of a PNP bipolar transistor Q1, to the base of an NPN bipolar transistor Q3, and to the drain of a current mirror MOSFET M2. Current mirror MOSFET M2 is coupled in current mirror relationship with a current mirror MOSFET M1 within a first, VCC-referenced current mirror stage 210, which further includes current mirror MOSFETs M7 and M18, to be described. The drain of current mirror MOSFET M1 sources the collector-emitter current I1 of NPN transistor Q2, and the drain of its associated current mirror MOSFET M2 is coupled to the emitter of PNP transistor Q1. The base of PNP transistor Q1 is coupled to receive a positive reference voltage VREF, while its collector is coupled to GND. Current mirror MOSFETs M1, M2, M7 and M18 have their source terminals referenced to the upper supply rail voltage VCC, and their gates coupled in common.

The collector of NPN transistor Q3 is coupled directly to the base of an NPN bipolar transistor Q5 and through a resistor R2 to the upper supply rail VCC. NPN transistor Q3 has its emitter coupled through a resistor R3 to GND. PNP transistor Q4 has its collector coupled to a current mirror MOSFET M3 of a second, GND-referenced current mirror stage 220, which further includes current mirror MOSFETs M4, M5 and M6, the sources of which are referenced to the lower supply rail GND. The collector of NPN transistor Q5 is coupled to the upper supply rail VCC, while its emitter is coupled to the base of PNP transistor Q4 and to the drain of current mirror MOSFET M4. The drain of current mirror MOSFET M5 is coupled to the commonly connected gates of current mirror MOSFETs M1, M2, M7 and M18 of the first, VCC-referenced current mirror stage 210, while the drain of current mirror MOSFET M6 is coupled to the input of a first output inverter INV1.

Inverter INV1 provides an output B representative of the logical value of the LSB applied to the SS pin. The input of inverter INV1 is also coupled to the output of a relatively small valued (e.g., three micro-amps (3 μA) 'pull-up' current source I1, that is referenced to the upper supply rail VCC. The purpose of 'pull-up' current source I1 is to slightly pull the input of inverter INV1 high, so that the default value of the output B of inverter INV1, and thereby the LSB of the device's address, will be a logical low ('0').

The drain of the current mirror MOSFET M7 within the current mirror stage 210 is coupled to the input of a second output inverter INV2, to which a 50 micro-amp (50 μA) pull-down current from a 'pull-down' current source I2, referenced to the lower supply rail GND, is coupled. 'Pull-down' inverter INV2 is used to supply an output terminal A with a logical low, as a valid reset signal RESET, in response to an external reset being applied to the SS pin. The reset signal RESET is coupled to the reset terminal of a downstream register (not shown).

In order to generate a soft-start frequency signal, on-chip section 200 further includes a multivibrator-configured oscillator stage 230, which contains a symmetrically arranged pair of MOSFET inverter stages M11-M12 and M13-M14, inputs of which are connected to cross-coupled input/output terminals of NAND gates ND1 and ND2. NAND gate ND2 has its output terminal further coupled to the input of a third output inverter INV3, whose output C provides the soft-start frequency signal. The outputs of inverter stages M11-M12 and M13-M14 are further coupled to respective capacitors C1 and C2 referenced to GND, and to the gates of MOSFETs M9 and M10.

The cross-coupled input/output terminals of NAND gates ND1 and ND2 are additionally coupled to the gates of respective output MOSFETs M15 and M16, which have their drain-source paths coupled between the outputs of inverter stages M11-M12 and M13-M14 and the drain of a MOSFET M17.

Each of MOSFETs M15 and M16 is used to switchably couple the voltage developed on an associated one of the capacitors C1 and C2 to the inverting (−) input of a comparator COMP. MOSFETS M12 and M13 of MOSFET inverter stages M11-M12 and M13-M14 are coupled in common to receive a current mirrored by the current mirror MOSFET M18 of the first, VCC-referenced current mirror stage 210.

As will be described, this current will charge one of the capacitors C1 and C2, depending upon which one of MOSFETs M12 and M13 is active or ON. The voltage developed on that capacitor will be coupled by its associated output MOSFET (M15 or M16), as turned-on by the output of one of the cross-coupled NAND gates ND1 and ND2, to the inverting (−) input of the comparator COMP. Comparator COMP compares this voltage with reference voltage VREF, which is applied to its non-inverting (+) input, and drives the cross-coupled logic gates ND1 and Nd2 in response thereto, so that inverter INV3 will produce a periodic soft-start oscillator output signal at an output terminal C. The frequency of this soft-start output signal is defined in accordance with the values of the capacitors C1 and C2, and the capacitor charging current supplied from the current mirror MOSFET M18 to the drains of MOSFETs M12 and M13.

MOSFET M17 has its gate coupled to receive a disable input DIS, its source coupled to GND, and its drain further coupled to the inverting (−) input of the comparator COMP. Comparator COMP has its output coupled in common to first inputs of each of OR gates OR1 and OR2, outputs of which are coupled to further inputs of NAND gates NAND1 and NAND2, respectively. OR gates OR1 and OR2 have second inputs thereof respectively coupled to the drains of MOSFETs M9 and M10 and to associated 10 μA current sources I3 and I4, referenced to VCC. MOSFETs M9 and M10 have their sources coupled to GND.

The manner in which the circuitry of the 'on-chip' signal generation section 200 responds to the application of different inputs to the pin SS of the 'off-chip' programming section 100, to generate a plurality of different outputs, will now be explained. As described above, these outputs include: 1—a register reset output signal RESET at output terminal A; 2—a logical value ('1' or '0') of an address bit (LSB) at output terminal B; and 3—a soft-start oscillator output signal at output terminal C, in association with the decoded address bit generated at output terminal B.

For a first mode of operation of the multi-function circuit, associated with specifying the address bit (LSB) as a logical '0', the input resistor R1 of its 'off-chip' programming section 100 is connected to GND; in addition, it will be assumed that an external reset signal 'EXT RESET' is applied to the gate of the MOSFET switch M8, so that MOSFET switch is turned ON, causing a logical low (GND='0') to be coupled to the SS pin by way of the source-drain path of MOSFET switch M8.

Coupling the input resistor R1 to ground causes a logical low (GND='0') voltage to be applied via resistor R1 and resistor Rp in series therewith to the emitter of NPN transistor Q2, so that NPN transistor Q2 and PNP transistor Q1 are turned ON. With NPN transistor Q2 turned ON, its collector-emitter current I1, which is sourced by the drain of current mirror MOSFET M1 of the first, VCC-referenced current mirror stage 210, is mirrored by the current mirror MOSFET M2 to the emitter-collector path of PNP transistor Q1. Also, with both transistors Q1 and Q2 turned ON, transistors Q3, Q4 and Q5, and therefore current mirror MOSFETs M3, M4, M5 and M6 of the second, GND-referenced current mirror stage 220, will be held OFF.

Because transistors Q1 and Q2 are complementary polarity devices, a summation of their respective base-emitter voltage drops, from the base of PNP transistor Q1 to the emitter of NPN transistor Q2, yields a voltage VREF (which is applied to the base of PNP transistor Q1) at the emitter of NPN transistor Q2. As a consequence, the collector-emitter current I1 of NPN transistor Q2 (which corresponds to the input current of the first, VCC-referenced current mirror stage 210) is equal to the emitter voltage VREF of NPN transistor Q2 divided by the sum of the values of resistors Rp and R1 series-connected between the emitter of NPN transistor Q2 and GND; namely, I1=VREF(R1+Rp).

This current I1 is used to perform two output functions: 1—to set the frequency of the soft-start oscillation signal produced at output C of the inverter INV3; and 2—to produce a pull-up current, which is a fraction (e.g., one-fourth) of the current I1, in opposition to the fixed (50 micro-amp) pull-down current applied by the (50 µA) 'pull-down' current source I2 to the input of inverter INV2, the output A of which is used to produce a valid register reset signal RESET.

To accomplish the first (soft-start oscillation signal-generating) function, the current I1 of current mirror MOSFET M1 is mirrored by current mirror MOSFET M18, and coupled to commonly connected source terminals of MOSFETs M12 and M13 of the MOSFET inverters M11-M12 and M13-M14 of oscillator stage 230. This mirrored current will charge one of the capacitors C1 and C2, depending upon which one of MOSFETs M12 and M13 is active or ON. The voltage developed on that capacitor will be coupled by its associated output MOSFET (M15 or M16), as turned-on by the output of one of the cross-coupled NAND gates ND1 and ND2, to the inverting (−) input of the comparator COMP. Comparator COMP compares this voltage with the reference voltage VREF applied to its non-inverting (+) input, and drives the oscillator's cross-coupled logic gates ND1 and ND2 in response thereto, so that inverter INV3 produces a periodic output signal at its output terminal C. As pointed out above, the frequency of this oscillation signal is defined in accordance with the values of capacitors C1 and C2, and the capacitor-charging current coupled from current mirror MOSFET M18 to the drains of MOSFETs M12 and M13.

To carry out the second (RESET) function, once the soft-start operation has completed, an external reset EXT RESET is applied to the gate of MOSFET M8, causing MOSFET M8 to turn ON. Turning on MOSFET M8 couples pin SS and resistor Rp to GND potential, so as to effectively remove resistor R1 from the circuit. This causes the current I1 to have a relatively large value. This larger valued current I1, when mirrored by current mirror MOSFET M7 and applied to the input of inverter INV2, is sufficient to overcome the fixed value (50 µA) of pull-down current being applied from 'pull-down' current source I2 to the input of inverter INV2, so that the input of inverter INV2 is effectively at a logical 'high'. The logical high at the input of inverter INV2 causes its output to go low, and thereby provide a valid reset signal RESET at output terminal A, for application to the reset terminal of a downstream register.

As described above, for the presently described first mode of operation, the input resistor R1 of the 'off-chip' programming section 100 is connected to GND, in order to specify the address bit (LSB) as a logical '0'. This causes transistors Q1 and Q2 to be turned ON, while transistors Q3, Q4 and Q5, as well as current mirror MOSFETs M3, M4, M5 and M6 of the second, GND-referenced current mirror stage 220, are held OFF. Since current mirror MOSFET M6 is turned OFF, and thereby supplies no current to the input of the inverter INV1, the relatively small value (3 µA) of the pull-up current supplied by pull-up current source I1 to the input of the inverter INV1 is sufficient to pull the input of inverter INV1 high, so that its output terminal B is a logical low ('0')—thereby specifying the address bit (LSB) as a logical '0', as intended.

For a second mode of operation of the multi-function circuit, associated with specifying the address bit (LSB) as a logical '1', the input resistor R1 of its 'off-chip' programming section 100 is connected to voltage rail VCC. (Whether or not MOSFET M8 is turned ON by the application of an external reset signal to its gate terminal will not be addressed here, since the operation of the circuit for producing a valid reset signal RESET at the output terminal A of inverter INV2, as a result of such a connection, will be the same as that for the first mode of operation, described above.)

For the second mode of operation, connecting the input resistor R1 to the logical high-associated supply rail VCC causes a relatively high voltage (VCC) to be coupled through the series-connected resistors R1 and Rp to the emitter of the NPN transistor Q2. As a result, the base-emitter junction of NPN transistor Q2 is reversed-biased, causing NPN transistor Q2 to be turned OFF. With NPN transistor Q2 turned off, no collector-emitter current flows therethrough (i.e., I1=0). However, the high voltage (VCC) applied through resistors R1 and Rp to the emitter of NPN transistor Q2 produces a relatively high positive voltage at its base, which is applied to the emitter of PNP transistor Q1, so that the base-emitter junction of PNP transistor Q1 is forward-biased, and transistor Q1 is turned ON.

With PNP transistor Q1 turned ON, a positive voltage (on the order of a base-emitter drop below the reference voltage VREF applied to its base) is coupled to the base of NPN transistor Q3, so that transistor Q3 is turned on. In addition, the high voltage (VCC) applied through resistors R1 and Rp to the emitter of NPN transistor Q2 is also coupled to the emitter of PNP transistor Q4, so that transistor PNP Q4 is also turned With PNP transistor Q4 turned ON, the collector-emitter current $I_{ceQ4}$ through PNP transistor Q4 flows into the current mirror MOSFET M3 and is mirrored by the current mirror MOSFETs M4, M5 and M6 of current mirror stage 220.

To determine the value of this current, it may be noted that transistors Q1 and Q3 are complementary polarity devices, so that a summation of their respective base-emitter voltage drops, from the base of PNP transistor Q1 to the emitter of NPN transistor Q3, yields a voltage VREF (which is applied to the base of PNP transistor Q1) at the emitter of NPN transistor Q3. As a result, a collector-emitter current I2 through NPN transistor Q3 is equal to a division of the value of the voltage value VREF (the emitter voltage of NPN transistor Q3) by the value of the emitter resistor R3 coupled between the emitter of NPN transistor Q3 and GND.

Because current I2 flows through the resistor R2 connected between the supply rail VCC and the base of NPN transistor Q5, the base voltage Vb5 of NPN transistor Q5 is equal to VCC−I2*R2. By inspection, the expression for the base voltage Vb5 of NPN transistor Q5 can be set equal to VREF; similarly, the collector-emitter voltage for PNP transistor Q4 can be set equal to the base voltage Vb5 of transistor Q5. Thus, the value of PNP transistor Q4's collector-emitter current $I_{ceQ4}$ (which flows into current mirror MOSFET M3 and is mirrored by current mirror MOSFETs M4, M5 and M6) can be represented as $I_{ceQ4}$=(VCC−Vce4)/R1+Rp). By inspection, the voltage difference component (VCC−Vce4) in the expression for the current $I_{ceQ4}$ is equal to VREF, so that rewriting the expression for this current yields the expression $I_{ceQ4}$=VREF/(R1+Rp)

This expression for the current $I_{ceQ4}$ reveals that the current $I_{ceQ4}$ produced for the second mode of operation of the multi-function circuit of the invention has the same value as the mirrored current I1 for the first mode of operation of the circuit, described above. In the second mode of operation of the circuit, this current ($I_{ceQ4}$=I1) is coupled to current mirror MOSFET M3 and mirrored by the current mirror MOSFET M5 of the second current mirror stage 220 to the first current mirror stage 210. It is then mirrored by the current mirror MOSFET M18 of the first current mirror stage 210, and coupled to the commonly connected source terminals of MOSFETs M12 and M13 of MOSFET inverters M11-M12 and M13-M14. This causes one of the capacitors C1 and C2 to be charged (depending upon which one of MOSFETs M12 and M13 is active or ON), so that the same soft-start oscillator output signal will be generated at the output terminal C of the inverter INV3, as described above for the first mode of operation of the circuit. Namely, the multi-function circuit of the invention is operative to produce the same soft-start frequency output signal, irrespective of whether the input resistor R1 for the single input pin SS of the 'off-chip' programming section 100 is coupled to a logical high (or logical '1') voltage value (VCC) or to a logical low (or logical '0') voltage value (GND).

For the second mode of operation, since input resistor R1 is connected to VCC to specify the address bit (LSB) as a logical '1', each of the current mirror MOSFETs M3, M4, M5 and M6 of the second current mirror stage 220 will be turned ON. Since current mirror MOSFET M6 is turned ON, it will supplies the input of inverter INV1 with a substantial value of current that is much larger than, and thereby overcomes, the relatively low valued (three micro-amps) pull-up current sourced from 'pull-up' current source I1. As a consequence, the input of inverter INV1 is driven to a logical low ('0'), making its output terminal B a logical high ('1'), and specifying the LSB address bit as a logical '1', as intended.

As will be appreciated from the foregoing description, the pin availability constraints of standard SOIC packages, such as eight-pin packages employed for half-bridge driver integrated circuit implementations used in DC-DC converter applications, is successfully addressed by a multi-function circuit, that is operative, in response to respectively different values of a control voltage to a single input/control pin, to controllably generate a plurality of respectively different functional outputs, including a decoded address bit-representative output, a soft-start oscillator signal output, and a reset output.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein, but intend to cover all such changes and modifications as are obvious to one of ordinary skill in the art.

What is claimed:

1. A multi-function circuit comprising:
 a programmable off-chip control input-coupling section comprising a single input pin adapted to receive a selected one of a plurality of different control inputs for programming respectively different parameters of said multi-function circuit; and
 an on-chip signal generation section comprising an oscillator stage which is operative to generate the same periodic signal, in response to either of two different control inputs being applied to said single input pin for programming either of two different parameters of said multi-function circuit, and which is operative to produce a further output signal in response to a third control input being applied to said single input pin, wherein the on-chip signal generation section has a given function/property that is selectively programmable by the value of the control input applied to said single input pin.

2. The multi-function circuit according to claim 1, wherein said oscillator stage is operative to generate said periodic signal as a prescribed soft-staff frequency signal for controlling switching times of output switching devices of a synchronous rectified buck mode DC-DC converter, in response to either of two control inputs, respectively representative of different logical values, being coupled to said single input pin.

3. The multi-function circuit according to claim 1, wherein said oscillator stage is operative to generate the value of a selected bit of a multi-bit address of a driver device with which said multi-function circuit is associated, in accordance with the value of a control voltage coupled to said single pin.

4. The multi-function circuit according to claim 1, wherein said oscillator stage is operative to produce said flirt her output signal as a reset output signal, in response to application of an external reset-representative control input to said single input pin.

5. The multi-function circuit according to claim 1, wherein said respectively different parameters of said multi-function circuit include a first, decoded address bit-representative output, that corresponds to the logical value of the control input, a second, soft-staff oscillator signal for establishing switching times of output devices of an associated DC-DC converter power supply system, in response to the application of either of two logical values of an address bit-defining control input, and a third, reset output, that is selectively produced in response to the coupling of a prescribed external reset-representative control input to the single input pin.

6. The multi-function circuit according to claim 1, wherein said oscillator stage is operative to generate an address output representative of a bit of a multi-bit address of a device containing said multi-function circuit, and trigger the generation of a soft-start frequency signal in response to either of two address bit-defining voltages being applied to an input resistor coupled to said single input pin of said off-chip programming section, and wherein said input pin is adapted to selectively receive an external register reset signal via a signal-coupling path that by-passes said input resistor.

7. The multi-function circuit according to claim 1, wherein said on chip signal generation section is operative, in response to the application of said external register reset signal to said single input pin by way of said signal-coupling path, to generate a reset output for application to a reset terminal of a downstream register.

8. The multi-function circuit according to claim 1, wherein said on chip signal generation section includes a relatively small valued resistor that couples said single input pin of said off chip programming section to input transistor circuit, which is operative to produce an output current mirrored by a first current mirror stage to control the generation of said periodic signal by said oscillator stage.

9. The multi-function circuit according to claim 8, wherein said input transistor circuit is operative to produce a second output current that is mirrored by a second current mirror stage to control the generation of said periodic signal by said oscillator stage, for a second of said two different parameters of said multi-function circuit.

10. A multi-function circuit comprising:
 a programming section having a single control pin that is adapted to receive a plurality of different control inputs that program respectively different parameters of said multi-function circuit; and a signal generation section, which is operative to generate a periodic output signal, in response to the application of either of two different control inputs to said single input pin that program respectively different parameters of said multi-function circuit, and which is operative to produce a farther output signal in response to a third control input being applied to said single input pin;

wherein said signal generation section includes a relatively small valued resistor that couples said single input pin of said programming section to input transistor circuit of said signal generation section, which is operative to produce a first output current mirrored by a first current mirror stage of said signal generation section, to control generation of a soft-staff oscillator signal.

11. The multi-function circuit according to claim 10 wherein said signal generation section includes an oscillator stage that is operative to generate said periodic output signal as a prescribed soft-staff frequency signal for controlling switching operations of output switching devices of a DC-DC converter, in response to either of two control inputs, respectively representative of different logical values, being coupled to said single input pin.

12. The multi-function circuit according to claim 11, wherein said signal generation section is operative, in accordance with the value of a control voltage coupled to said single pin, to generate the value of a selected bit of a multi-bit address of a driver device that controls switching operations of said output switching devices of said DC-DC converter.

13. The multi-function circuit according to claim 11, wherein said respectively different parameters of said signal generation section circuit include a first, decoded address bit-representative output representative of the logical value of said control input, a second signal, comprising the soft-start oscillator signal for controlling switching operations of switching devices of an associated DC-DC converter power supply system, in response to the application of either of two logical values of an address bit-defining control input, and a third, reset output, that is selectively produced in response to the coupling of a prescribed external reset-representative control input to the single input pin.

14. The multi-function circuit according to claim 13, wherein said input transistor circuitry is operative to produce a second output current that is mirrored by a second current mirror stage to control the generation of said periodic output signal by said oscillator stage.

15. The multi-function circuit according to claim 10, wherein said signal generation section is operative to produce said further output signal as a reset output signal, in response to application of an external reset-representative control input to said single input pin.

16. A method of controllably generating a plurality of respectively different functional outputs in accordance with respectively different values of a control input, said method comprising the steps of:
   (a) coupling said respectively different values of said control input to a single control pin that is off chip;
   (b) generating a periodic output signal on-chip, in response to the application of either of two different control inputs to said single control pin; and
   (c) generating a farther output signal in response to application of a third control input to said single control pin.

17. The method according to claim 16, wherein step (b) comprises generating a prescribed soft-staff frequency signal for controlling switching operations of output switching devices of a DC-DC converter, in response to either of two control inputs, respectively representative of different logical values, being coupled to said single control pin.

18. The method according to claim 17, wherein step (b) comprises generating the value of a selected bit of a multi-bit address of a driver device that controls switching operations of said output switching devices of said DC-DC converter, in accordance with the value of said control input coupled to said single control pin, and wherein step (c) comprises generating said further her output signal in response to application of an external reset-representative control input to said single control pin.

* * * * *